US008947969B2

(12) United States Patent
Shim et al.

(10) Patent No.: US 8,947,969 B2
(45) Date of Patent: Feb. 3, 2015

(54) SECONDARY MEMORY UNITS AND SYSTEMS INCLUDING THE SAME

(75) Inventors: In-bo Shim, Gyeonggi-do (KR); Woo-sung Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 195 days.

(21) Appl. No.: 13/604,681

(22) Filed: Sep. 6, 2012

(65) Prior Publication Data
US 2013/0155800 A1 Jun. 20, 2013

(30) Foreign Application Priority Data

Dec. 20, 2011 (KR) ........................ 10-2011-0138489

(51) Int. Cl.
*G11C 8/00* (2006.01)
(52) U.S. Cl.
USPC .................. 365/230.05; 365/233.13; 365/226
(58) Field of Classification Search
USPC ................................ 365/230.05, 233.13, 226
See application file for complete search history.

(56) References Cited

U.S. PATENT DOCUMENTS

| 7,778,101 | B2 * | 8/2010 | Chen ............................. 365/228 |
| 7,864,604 | B2 * | 1/2011 | David ........................... 365/191 |
| 8,120,945 | B2 * | 2/2012 | Chevallier et al. ............. 365/148 |
| 8,164,937 | B2 * | 4/2012 | Norman ......................... 365/63 |
| 8,270,226 | B2 * | 9/2012 | Choi et al. ................. 365/189.05 |
| 8,705,260 | B2 * | 4/2014 | Chevallier et al. ............. 365/51 |
| 2010/0142307 | A1 | 6/2010 | Sartore |

FOREIGN PATENT DOCUMENTS

| KR | 1020100027441 A | 3/2010 |
| KR | 1020100101958 A | 9/2010 |

* cited by examiner

*Primary Examiner* — Pho M Luu
(74) *Attorney, Agent, or Firm* — Myers Bigel Sibley & Sajovec, P.A.

(57) ABSTRACT

A secondary memory unit includes a first substrate that has a non-volatile memory unit mounted thereon that is configured to receive power from an external power supply. A second substrate has an energy storage and supply medium mounted thereon. An energy transfer medium is provided that electrically connects the first substrate and the second substrate. The energy storage and supply medium is configured to supply an operating power to the non-volatile memory unit when power from the external power supply to the non-volatile memory unit is cut off.

20 Claims, 11 Drawing Sheets

US 8,947,969 B2

SECONDARY MEMORY UNITS AND SYSTEMS INCLUDING THE SAME

CROSS-REFERENCE TO RELATED APPLICATION

This application claims the benefit under 35 U.S.C. §119 of Korean Patent Application No. 10-2011-0138489, filed on Dec. 20, 2011, in the Korean Intellectual Property Office, the disclosure of which is incorporated herein in its entirety by reference.

BACKGROUND

The inventive concept relates to secondary memory units and to systems that include such secondary memory units, and more particularly, to secondary memory units that may facilitate product development and that have excellent thermal characteristics, and to system that include such secondary memory units.

As the demand for improvements in performance and reliability of various electronic systems is increasing, the performance and reliability of a server system and a personal computer (PC) system have been continuously improved. Efforts for improving the performance and reliability of secondary memory units that may be used in such server systems and PC systems have also been made. When a main power to be supplied to a system is unexpectedly cut off, a super capacitor has been used as a unit for supplying power to the system while information used in work is stored in a secondary memory unit.

SUMMARY

The inventive concept provides a secondary memory unit having improved reliability and stability and that facilitates simpler product development and maintenance, as well as systems that include such secondary memory units.

According to an aspect of the inventive concept, secondary memory units are provided that include: a first substrate; a non-volatile memory unit that is mounted on the first substrate and which is configured to receive power from an external power supply; a second substrate that is separate from the first substrate; an energy storage and supply medium that is mounted in the second substrate; and an energy transfer medium that is configured to electrically connect the first substrate and the second substrate. The energy storage and supply medium is configured to supply power to the non-volatile memory unit when power from the external power supply to the non-volatile memory unit is cut off.

The second substrate may be spaced apart from the first substrate. The secondary memory unit may further include a first case in which the first substrate is at least partially accommodated and a second case in which the second substrate is at least partially accommodated. The first case may cover both top and bottom surfaces of the first substrate, and the second case may cover both top and bottom surfaces of the second substrate. A thermally insulating material may be deposited between the first substrate and the second substrate. Optionally, a spacer may be disposed between the first case and the second case. The energy transfer medium may electrically connect the first substrate and the second substrate via the spacer.

The first case and the second case may be arranged in a direction perpendicular to or in parallel to the first substrate. The first case may include metal or a carbon-based material, and the second case may include a polymer material. The second case may include a recess and the first case may be configured to be inserted in the recess to be combined with the second case.

The first case may expose the bottom surface of the first substrate, and the second case may expose the top surface of the second substrate, and the second substrate may be disposed below the first substrate, and the first substrate and the second substrate may be thermally insulated from each other by an intervening insulating material. In this case, the first case may further include a guide, and the second case may be guided by the guide and may be movable.

The secondary memory unit may further include a display device that indicates a charging amount of the one or more energy storage and supply mediums.

According to another aspect of the inventive concept, there is provided a system including: a central processing unit (CPU); an input unit for inputting information to the CPU; an output unit for outputting information from the CPU; and a secondary memory unit of claim 1, for transferring stored information to the CPU or for storing information output from the CPU.

According to another aspect of the inventive concept, there is provided a secondary memory unit including: a first substrate on which one or more non-volatile memory units are mounted; and a first case in which the first substrate is accommodated, wherein the first case includes a first terminal configured to supply normal power to the first substrate and a second terminal configured to supply backup power to the first substrate when the normal power is cut off.

According to another aspect of the inventive concept, secondary memory units are provided that include a first case that includes a first substrate that has a non-volatile memory unit mounted thereon; a second case that has a second substrate that has an energy storage and supply medium mounted thereon; and an energy transfer medium that electrically connects the first substrate to the second substrate and that is configured to selectively supply energy from the energy storage and supply medium to the non-volatile memory unit.

In some embodiments, the secondary memory unit may further include at least one thermally insulative material that is disposed between the first substrate and the second substrate, where the first case is at least partially formed of a thermally conductive material and the second case is at least partially formed of a thermally insulative material. The energy transfer medium may include a plug that is associated with one of the first case or the second case and a socket that is associated with the other of the first case or the second case. The first and second substrate may each include a top surface, a bottom surface and a plurality of edge surfaces, and a first of the edge surfaces of the first substrate may face a first of the edge surfaces of the second substrate. Moreover, the first case may be slidably moveable with respect to the second case.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
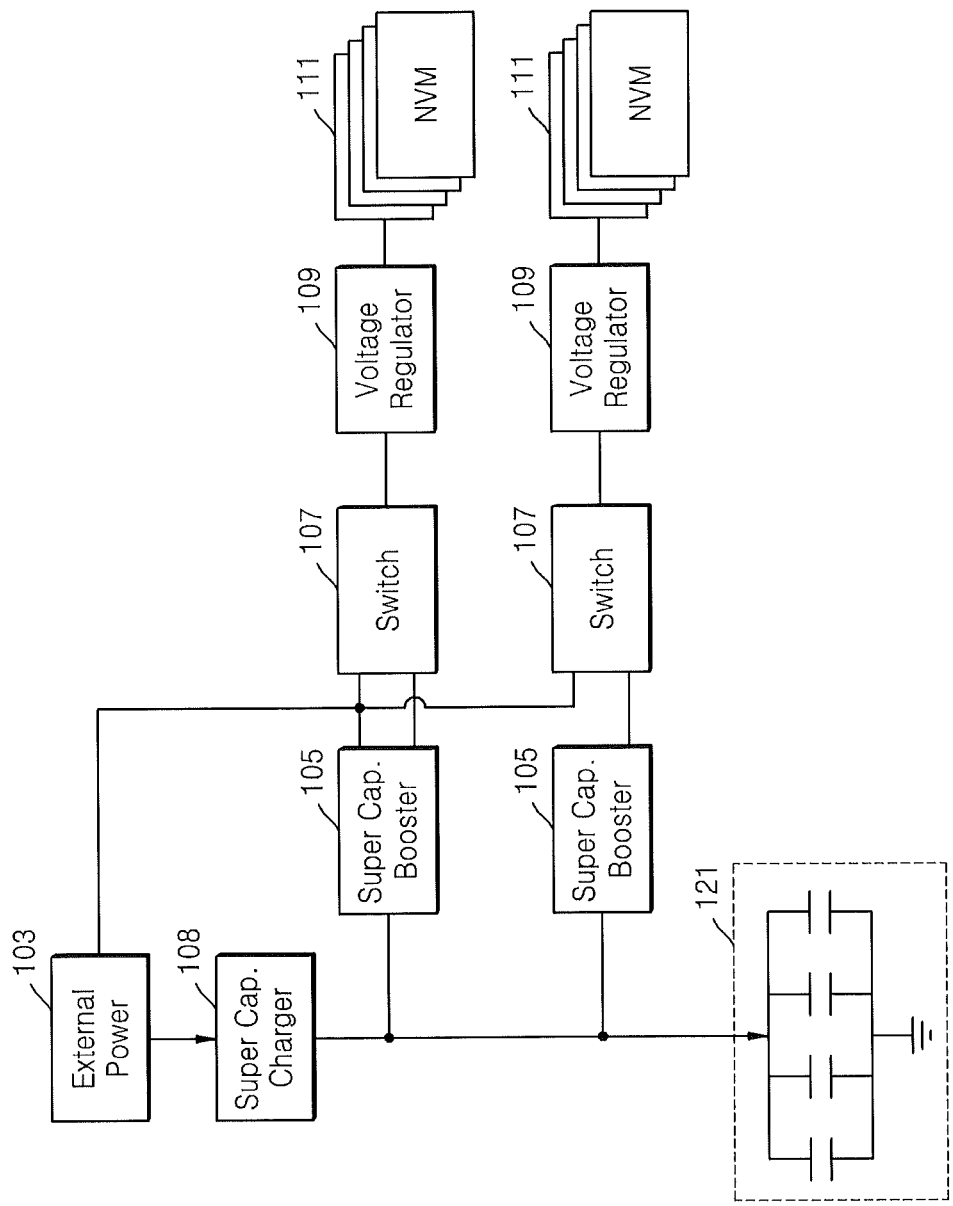
FIG. 1 is a block diagram illustrating the circuit structure of various secondary memory units according to embodiments of the inventive concept.

The attached drawings are for illustrating example embodiments of the inventive concept in order to provide a sufficient understanding of the inventive concept. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals refer to like elements. It will also be appreciated that various elements and regions in the drawings are schematically shown. Thus, the inventive concept is not limited by a relative size or distance in the attached drawings.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
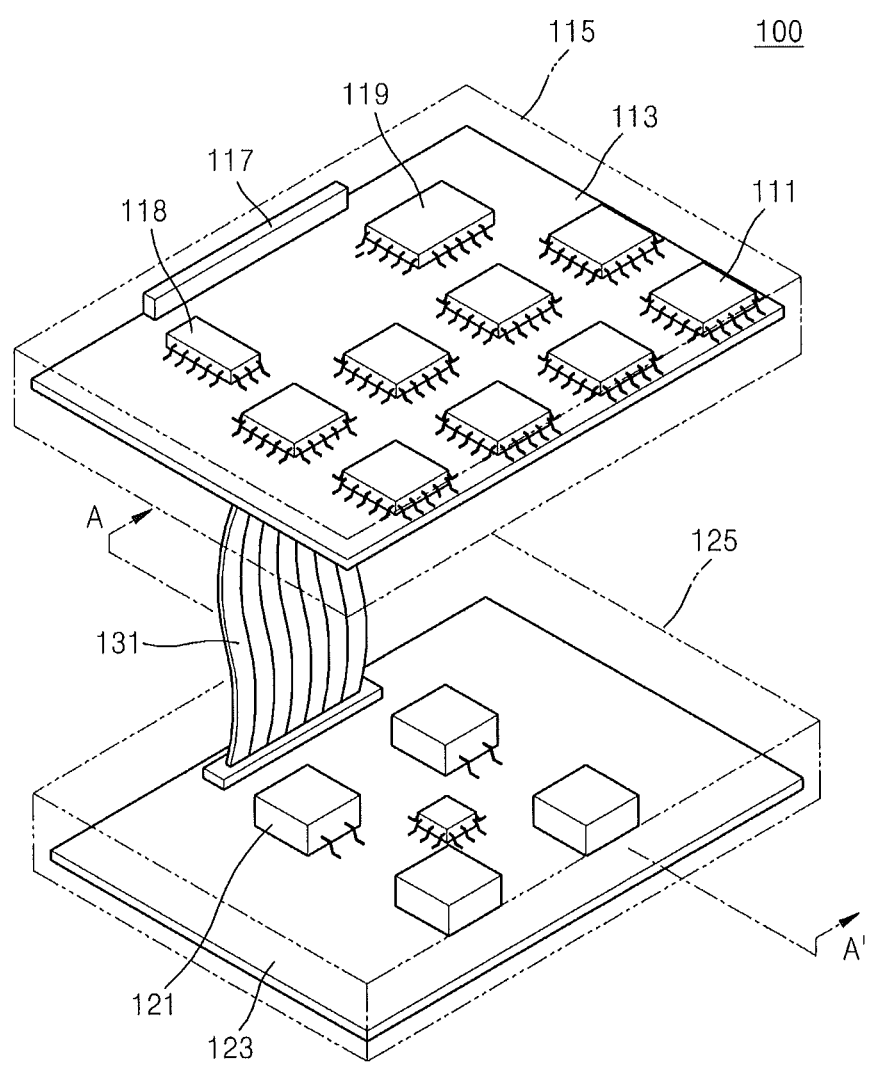
FIG. 2 is a schematic perspective view of a secondary memory unit according to an embodiment of the inventive concept.

FIG. 1 is a block diagram that illustrates the circuit structure of various secondary memory units according to embodiments of the inventive concept. FIG. 2 is a schematic perspective view of a secondary memory unit 100 according to an embodiment of the inventive concept. The secondary memory unit 100 of FIG. 2 may have the circuit structure illustrated in the block diagram of FIG. 1.

Referring to FIGS. 1 and 2, the secondary memory unit 100 includes a first substrate 113 and a second substrate 123. The first substrate 113 and the second substrate 123 may be separate and distinct substrates. Herein, if first and second substrates are referred to as being "separate substrates," this means that the first and second substrates are two different parts, and the term "separate and distinct substrates" means that the first and second substrates are separate substrates that have not been joined together. One or both of the first and second substrates 113, 123 may be implemented using, for example, a printed circuit board (PCB) or a flexible printed circuit board (FPCB). Other structures may also be used to implement one or both of the first substrate 113 and/or the second substrate 123. Since the first substrate 113 and the second substrate 123 are separate and distinct substrates, heat transfer between semiconductor chips and other devices that are mounted on the first substrate to semiconductor ships and/or other device that mounted on the second substrate, and vice versa, may be reduced.

One or more non-volatile memory units 111 may be mounted on the first substrate 113. The non-volatile memory units 111 may be flash memory, phase-change RAM (PRAM), resistive RAM (RRAM), ferroelectric RAM (Fe-RAM), magnetic RAM (MRAM), and the like; however, aspects of the inventive concept are not limited thereto. The flash memory may be a NAND flash memory, although it may also be another type of flash memory. The non-volatile memory units 111 may all be the same type of memory unit or multiple different types of non-volatile memory units 111 may be mounted on the first substrate 113. Each non-volatile memory unit 111 may be one semiconductor die or may include multiple semiconductor dies that are, for example, stacked on top of one another.

One or more energy storage and supply mediums 121 may be mounted on the second substrate 123. The energy storage and supply mediums 121 may be any devices that may store and supply energy properly such as, for example, super capacitors, lithium ion batteries, nickel cadmium batteries, nickel metal hydride batteries, and the like. In some embodiments, the energy storage and supply mediums 121 may comprise one or more super capacitors that are implemented as, for example, an electric double layer capacitor (EDLC) or a multi-layer ceramic capacitor (MLCC). However, it will be appreciated that embodiments of the inventive concept are not limited thereto.

The first substrate 113 and the second substrate 123 may be accommodated in separate cases so that a degree of thermal isolation is provided between the first substrate 113 and the second substrate 115. For example, the first substrate 113 may be accommodated in a first case 115, and the second substrate 123 may be accommodated in a second case 125.

In some embodiments, the first case 115 may include terminals 117 for receiving power from an external device and for inputting/outputting data. In other embodiments, the terminals 117 may be provided on the first substrate 113, and the first case may include an opening that provides access to the first terminals 117. In either case, a volatile memory device 118 and/or a controller 119 may also be mounted on the first substrate 113 in addition to the non-volatile memory units 111. The terminals 117 may provide an interface based on, for example, serial advanced technology attachment (SATA) standards, parallel advanced technology attachment (PATA) standards, or small computer system interface (SCSI) standards.

The controller 119 may further perform functions of wear leveling, error correction and/or failed block control. In addition, the controller 119 may include programs that may exchange signals with the external device by using a method based on the SATA standards, the PATA standards, or the SCSI standards. Here, the SATA standards include all SATA series standards, such as SATA-1, SATA-2, SATA-3, and external SATA (e-SATA). The PATA standards include all IDE series standards, such as integrated drive electronics (IDE) and enhanced-IDE. Serial ATA revision 2.6 published by the Serial ATA International Organization published on Feb. 15, 2007 is incorporated by reference herein in its entirety. The controller 119 may comprise a single die or may comprise multiple dies and/or units.

The volatile memory device 118 may be, for example, a dynamic random access memory (DRAM) device. The volatile memory device 118 may function as a buffer for exchanging data between the non-volatile memory devices 111 and the controller 119.

The first substrate 113 and the second substrate 123 may be electrically connected to each other by means of an energy transfer medium 131. As illustrated in FIG. 1, under normal operating conditions, power is supplied to the first substrate 113 from an external power supply 103 (as opposed to being provided from the second substrate 123). When the supply of power from the external power supply 103 is cut off for any reason, power may still be supplied to the non-volatile memory devices 111 from the energy storage and supply medium 121 via the second substrate 123 and the energy transfer medium 131. A switch unit 107 (see FIG. 1) may further be provided in order to switch the supply source for the power from the external power source 103 to the energy transfer medium 131 when the supply of power from the external power supply 103 is cut off. The switch unit 107 may be implemented as a diode device, for example; however, embodiments of the inventive concept are not limited thereto. When the first substrate 113 and the second substrate 123 are separate substrates, the switch unit 107 may be disposed on the first substrate 113, within the first case 115, on the second substrate 123 and/or within the second case 125.

In some embodiments of the present invention, an energy storage and supply medium booster 105 may also be provided and may be used to boost a voltage of the power supplied from the energy storage and supply medium 131. The energy storage and supply medium booster 105 may be disposed, for example, on the first substrate 113 or on the second substrate 123. In addition, a voltage regulator 109 may further be provided in order to more uniformly regulate the voltage that is supplied to the non-volatile memory devices 111.

In some embodiments, the energy transfer medium 131 may comprise a cable as is illustrated in FIG. 2, but it will be appreciated that embodiments of the present invention are not limited thereto. The energy transfer medium 131 may be any electrical connection mean. For example, the energy transfer medium 131 may be a cable, a socket/plug, a pin, a connector, or the like; however, aspects of the inventive concept are not limited thereto. For example, the energy transfer medium 131 may be a wireless energy transfer medium that may transfer electrical energy, such as a transformer or an inductor. The energy transfer medium 131 may include a ground line, a power line, a signal line, or the like. In some embodiments, the power line may be 1.5 V, 3.3 V, 5 V, and 12 V; however, aspects of the inventive concept are not limited thereto.

As illustrated in FIG. 1, when power is supplied to the non-volatile memory units 111 from the external power supply 103, power may also be supplied to the energy storage and supply medium 121 which power may be used to charge the energy storage and supply medium 121. In some embodiments, the time required to charge the energy storage and supply medium 121 may be on the order of several seconds to tens of seconds. However, aspects of the inventive concept are not limited thereto. In addition, an energy storage and supply medium charger 108 may also be provided as a separate unit that may be used to control the charging of the energy storage and supply medium 121.

In addition, as illustrated in FIGS. 1 and 2, the first substrate 113 and the second substrate 123 as separate elements from the first case 115 and the second case 125 may constitute part of the secondary memory unit 100. Furthermore, the energy storage and supply medium 121 is a separate element from the second substrate 123 and may be mounted on the second substrate 123 and constitute part of the secondary memory unit 120.

Figure 3:
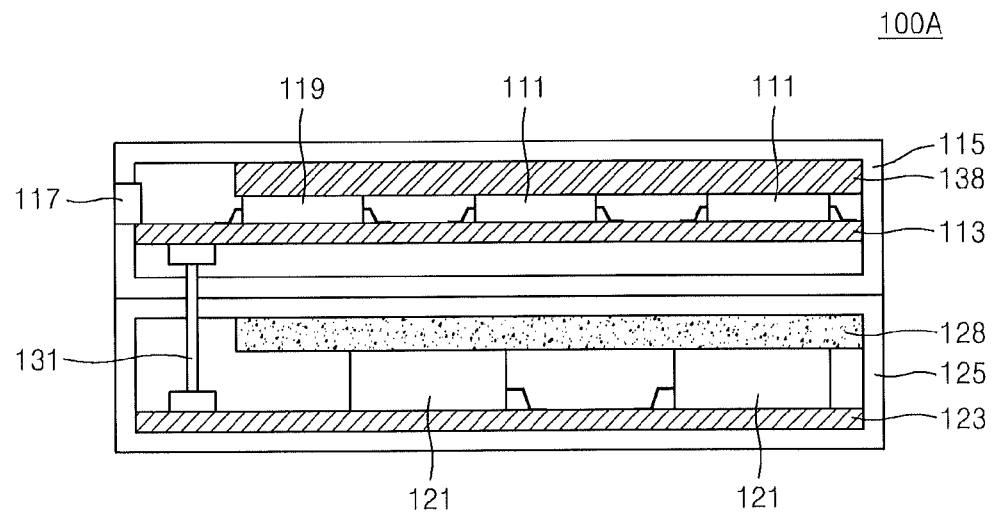
FIG. 3 is a side cross-sectional view of the secondary memory unit of FIG. 2 taken along a line A-A' of FIG. 2.

FIG. 3 is a side cross-sectional view, taken along a line A-A' of FIG. 2, that illustrates a first embodiment 100A of the secondary memory unit 100 of FIG. 2.

Referring to FIG. 3, the first case 115 for accommodating the first substrate 113 and the second case 125 for accommodating the second substrate 123 may be stacked vertically with regard to each other. In particular, the first case 115 may cover both top and bottom surfaces of the first substrate 113. In addition, the second case 125 may cover both top and bottom surfaces of the second substrate 123. With the configuration illustrated in FIG. 3, the amount of heat transferred from the first substrate 113 to the energy storage and supply medium 121 may be reduced.

In addition, as illustrated in FIG. 3, an insulating board 128 that is formed of an insulating material may be further disposed between a top surface of the energy storage and supply medium 121 and the second case 125. The insulating board 128 may be formed of material having a lower thermal conductivity than the thermal conductivity of the first case 115 and/or the second case 125. By way of example, in some embodiments, the insulating board 128 may comprise epoxy-based polyurethane, aerogel, Teflon, mica, or the like. The insulating board 128 may reduce any tendency of the temperature of the energy storage and supply medium 121 from rising excessively due to heat transferred from the outside, including from the first substrate 113, to the energy storage and supply medium 121 via conduction.

In addition, a heat-dissipation plate 138 for promoting heat transfer may be further disposed between a top surface of the controller 119 and/or top surfaces of the non-volatile memory units 111 and the first case 115. The heat-dissipation plate 138 may be formed of material having higher thermal conductivity than that of the material used to form the first case 115. The heat-dissipation plate 138 may be formed of metal, such as copper, aluminum, stainless steel, or the like; however, aspects of the inventive concept are not limited thereto. The heat-dissipation plate 138 may allow heat generated in various semiconductor devices disposed in the first case 115 to dissipate in an upward direction and thus may reduce the amount of heat transferred to the energy storage and supply medium 121.

The first substrate 113 and the second substrate 123 may be electrically connected to each other via an energy transfer medium 131. Although, in FIG. 3, the energy transfer medium 131 comprises a unitary structure that is connected between the first and second substrates 113, 123 by perforating the first case 115 and the second case 125, it will be appreciated that the energy transfer medium 131 may include two or more parts, as will now be described with reference to FIG. 4.

Figure 4:
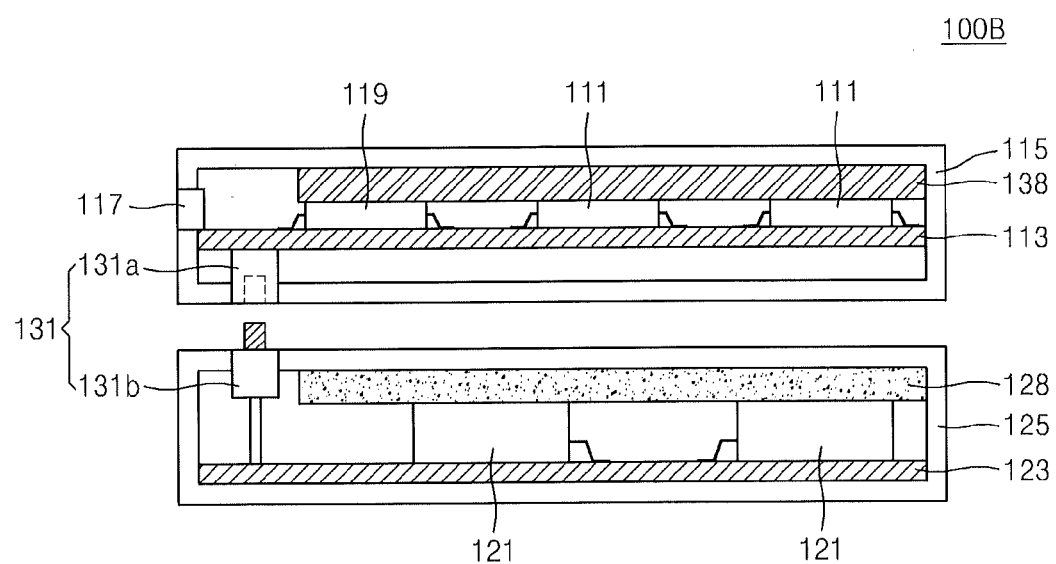
FIGS. 4 through 6 are side cross-sectional views taken along a line A-A' of FIG. 2 of secondary memory units according to further embodiments of the inventive concept.

FIG. 4 is a side cross-sectional view, again taken along the line A-A' of FIG. 2, of a second example embodiment 100B of the secondary memory unit 100.

Referring to FIG. 4, the energy transfer medium 131 may be configured to be attached and detached. That is, as illustrated in FIG. 4, the energy transfer medium 131 may include a socket 131a disposed on or in the first case 115 and a plug 131b disposed on the second case 125, which are combined with each other to constitute the energy transfer medium 131. While not illustrated in the drawings, it will be appreciated that in other embodiments the plug may be disposed on the first case 115 and the socket may be disposed on or in the second case 125. It will also be appreciated that either the plug 131a and/or the socket 131b may be implemented on or in the respective first and second substrates 113, 123 or may be mounted externally on the first and/or second cases 115, 125. Thus, herein reference may be made to the plug or socket being "associated with" one of the first or second cases 115, 125 to make clear that actual location of the plug and/or socket within or on one of the first or second cases 115, 125 is unimportant. It will also be appreciated that in still further embodiments the energy transfer medium may comprise a cable having plugs and/or sockets on either end thereof and plugs and/or sockets on each of the first case 115 and the second case 125 that are configured to receive the plugs/sockets that are mounted on the cable. In such embodiments, each of the first and second case 115, 125 might include the same type of connector.

When the energy transfer medium 131 is configured using a plug and socket connection, if a fatal defect occurs in the energy storage and supply medium 121, the defect may be eliminated by replacing only the second case 125 in which the energy storage and supply medium 121 is mounted. Since, according to the related art, an energy storage and supply medium and the non-volatile memory units are mounted on a common (single) substrate, the non-volatile memory unit(s) have to be replaced when a fatal defect occurs in the energy storage and supply medium.

Figure 5:
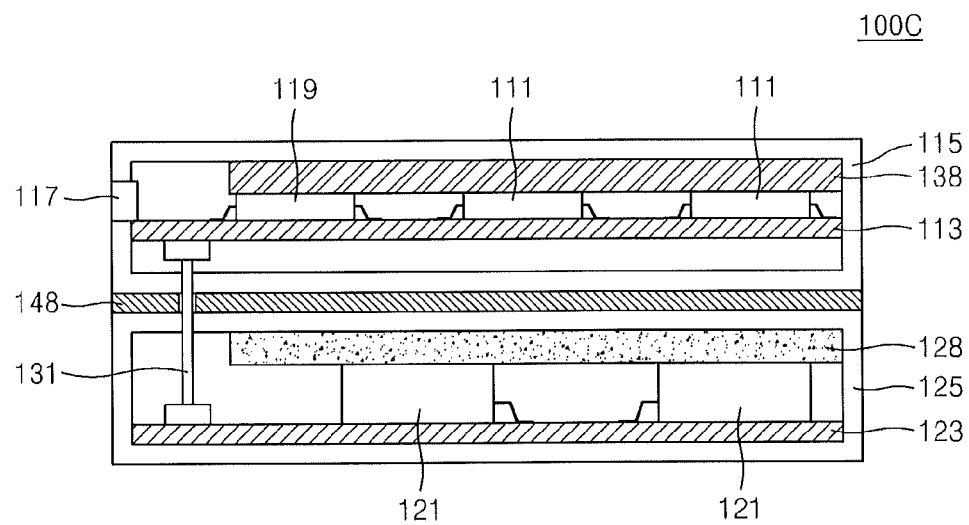

FIG. 5 is a side cross-sectional view, taken again along line A-A' of FIG. 2, of a the example embodiment 100C of the secondary memory unit 100.

As shown in FIG. 5, in the example embodiment 100C, an insulating material 148 may be disposed between the first case 115 and the second case 125. The insulating material 148 may be material having lower thermal conductivity than the first case 115 and/or the second case 125 such as, for example, epoxy-based polyurethane, aerogel, Teflon, mica, or the like. The insulating material 148 may prevent the temperature of the energy storage and supply medium 121 from rising excessively due to heat transferred from the outside (e.g., from the first case 115) to the energy storage and supply medium 121 via conduction.

Figure 6:
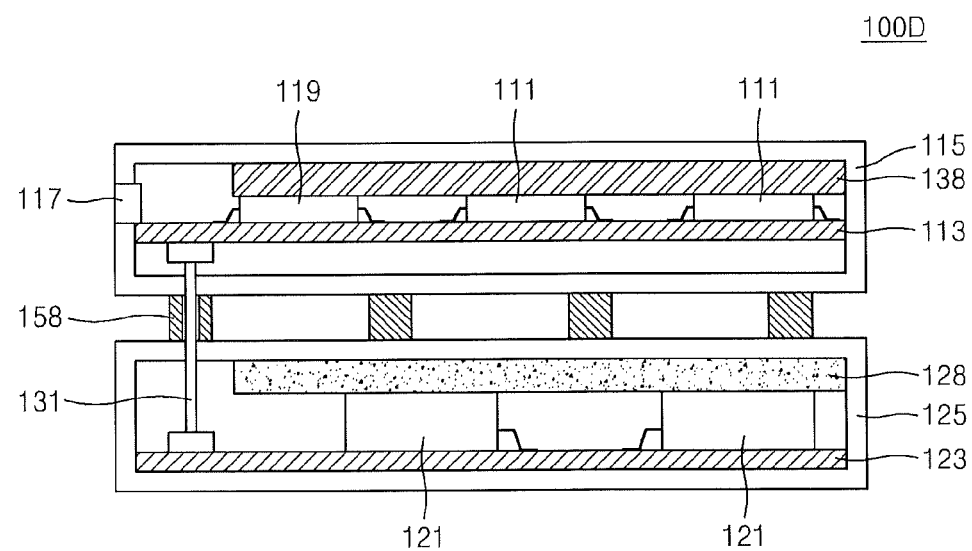

FIG. 6 is a side cross-sectional view, taken again along the line A-A' of FIG. 2, of a fourth example embodiment 100D of the secondary memory unit 100.

As shown in FIG. 6, in this embodiment a spacer 158 may be disposed between the first case 115 and the second case 125. The spacer 158 may maintain a pre-determined spacing between the first case 115 and the second case 125. Thus, the spacer 158 may be formed of material that may ensure and maintain the space between the first case 115 and the second case 125; however, aspects of the inventive concept are not limited thereto. Furthermore, the spacer 158 may be formed of material that suppresses thermal transfer between the first case 115 and the second case 125. For example, the spacer 158 may be formed of material, such as epoxy-based polyurethane, aerogel, Teflon, mica, or the like. Thus, the amount of heat transferred from various semiconductor devices disposed in the first case 115 to the energy storage and supply medium 121 may be reduced.

Furthermore, as illustrated in FIG. 6, the energy transfer medium 131 may connect the first substrate 113 and the second substrate 123 electrically by perforating the spacer 158. It will be appreciated by one of ordinary skill in the art that the energy transfer medium 131 may be configured so that it may be detached from the secondary memory unit 100D.

In the example embodiments of FIGS. 3 through 6, the material used in forming the first case 115 may be selected to transfer heat better than material used in forming the second case 125. For example, the first case 115 may be formed of metal, such as copper, aluminum, or stainless steel, or a carbon-based material, and the second case 125 may be formed of polymer, such as an epoxy resin, polymethylmethacrylate (PMMA), polycarbonate (PC), polyethylene (PE), polypropylene (PP). Thus, a tendency to transfer heat generated in various semiconductor devices mounted on the first substrate 113 to another external device or medium rather than to transfer the heat to the energy storage and supply medium 121 disposed below the first substrate 113 may be increased.

Alternatively, not the whole of the first case 115 may be formed of metal but only part thereof may be metal or a carbon-based material, and the other part thereof may be formed of polymer. For example, when the first case 115 is disposed above the energy storage and supply medium 121, since it may be desirable to promote heat transfer in an upward direction and desirable to suppress heat transfer in a downward direction, at least part of an upper portion of the first case 115 may be formed of metal or a carbon-based material, while the bottom portion of the first case 115 may be formed of a material having a lower heat transfer capability. In contrast, when the first case 115 is disposed below the energy storage and supply medium 121, at least part of a bottom portion of the first case 115 may be formed of metal or a carbon-based material, while at least a part of the upper portion of the first case 115 may be formed of a material having a lower heat transfer capability.

Figure 7A:
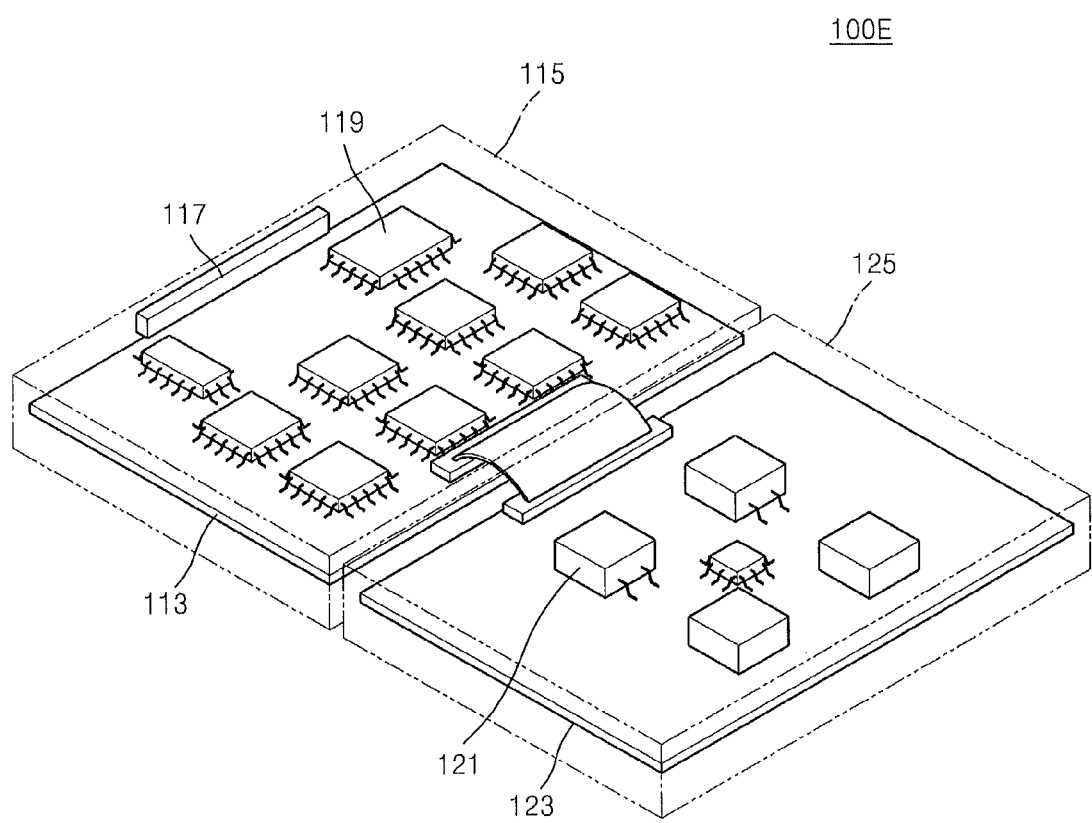
FIGS. 7A and 7B are perspective views of secondary memory units according to still further embodiments of the inventive concept.
Figure 7B:
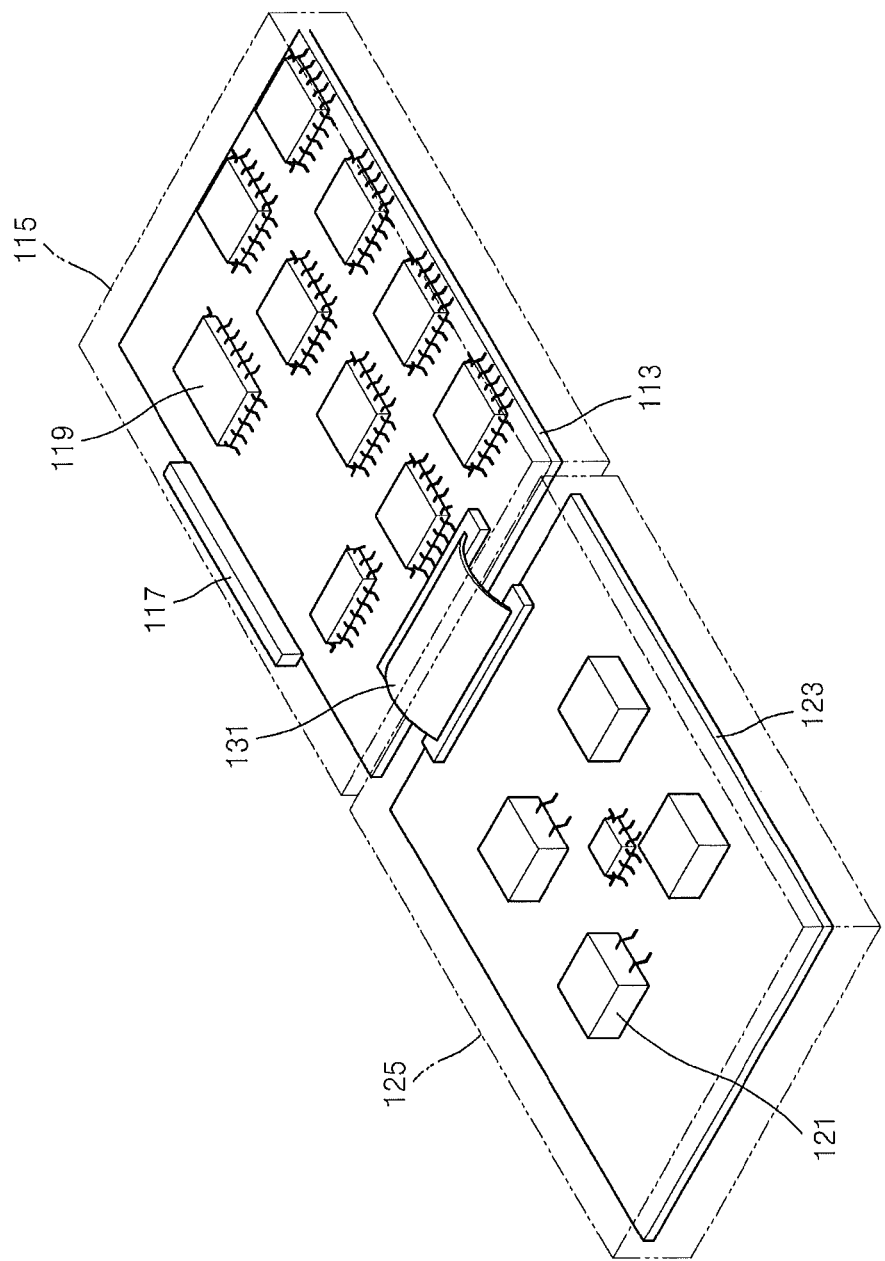

FIGS. 7A and 7B are perspective views of secondary memory units according to further embodiments of the inventive concept.

As illustrated in FIGS. 7A and 7B, the relative positions of the first case 115 and the second case 125 that are provided in the embodiments 100A-100D may be modified in various ways. For example, in FIG. 7A, the first case 115 and the second case 125 are disposed side-by-side instead of being vertically stacked. In FIG. 7B, the first case 115 and the second case 125 are disposed in forward and backward directions. In both cases, the first substrate 113 and the second substrate 123 are connected to each other via the energy transfer medium 131, which in both embodiments is illustrated as being a cable. However, it will be appreciated by one of ordinary skill in the art that another type of energy transfer medium 131 may be used such as, for example, any of the other energy transfer mediums that were described above. It will also be appreciated that one or more insulative materials may be disposed between the first case 115 and the second case 125, and/or that end portions of the first case 115 and the second case 125 that face each other may be made of materials that have low thermal transfer properties, while other portions of, for example, the first case 115 may be made of a material having good thermal transfer properties such as, for example, a metal.

In this way, the first case 115 and the second case 125 are disposed laterally so that the amount of heat generated in the first case 115 that may be transferred to the second case 125 due to convection may be minimized and a contact area between the first case 115 and the second case 125 may be reduced to further reduce heat transfer by conduction.

Figure 8:
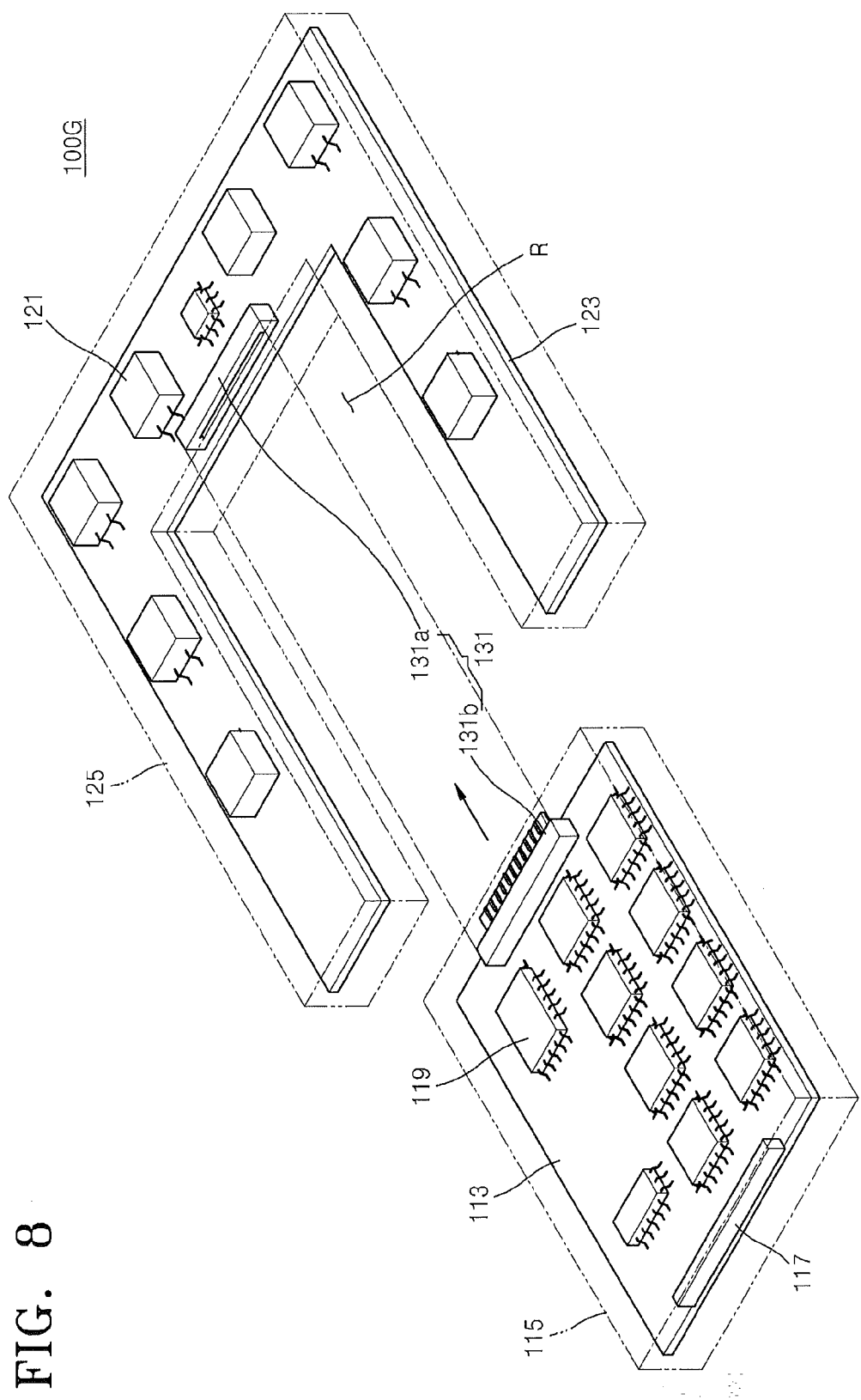
FIG. 8 is a perspective view of a secondary memory unit according to yet another embodiment of the inventive concept.

FIG. 8 is a perspective view of a secondary memory unit 100G according to yet another embodiment of the inventive concept.

As shown in FIG. 8, a recess R may be formed in the second case 125, and the second substrate 123 may be shaped to fit within the second case 125. The first case 115 may be inserted into the recess R and may be combined with the second case 125. In addition, the recess R may be designed so that one or more of the exterior surfaces of the second case 125 that define the recess R may contact external surfaces of the first case 115 when the first case 115 is inserted into the recess R.

In this case, the energy transfer medium 131 may include a socket 131a and a plug 131b. FIG. 8 illustrates the case where the plug 131b is disposed on the first case 115 and the socket 131 a is disposed on or in the second case 125. However, it will be appreciated by one of ordinary skill in the art that a socket may be disposed on or in the first case 115 and a plug may be disposed on the second case 125.

In the above-described embodiments, the first case 115 and the second case 125 are configured to be detachable from each other, and thus may be thermally separated from each other to reduce the possibility that the energy storage and supply medium 121 may become overheated. Meanwhile, the first substrate 113 on which the non-volatile memory units 111 are mounted and the second substrate 115 on which an energy storage and supply medium 121 is mounted may be developed separately and in parallel.

When the secondary memory units 100A-100G comprise solid state drives (SSD) that are used in a notebook computer or a personal computer (PC), the need for an energy storage and supply medium 121 is not so high, and SSDs that are used in notebook computers and PCs often do not include an energy storage and supply medium 121. In contrast, when SSDs are used in server computers, stability of information recording is very significant and thus, the demand for the energy storage and supply medium is very high.

Thus, when the first case 115 and the second case 125 are not separated from each other and are developed as a single body (e.g., when the secondary memory unit only has a single case), it may be necessary to develop a first version of the secondary memory unit for use in the notebook computer or the PC (i.e., a version that does not include an energy storage and supply medium) and a second version for use in the server computer (i.e., a version that includes an energy storage and supply medium). However, when the first case 115 and the second case 125 are separated from each other and are developed separately, like in the concept of the inventive concept, the first substrate 113 including a non-volatile memory unit and the first case 115 may be developed regardless of whether or not the end application requires an energy storage and supply medium so that technology development may be more efficiently performed.

Figure 9:
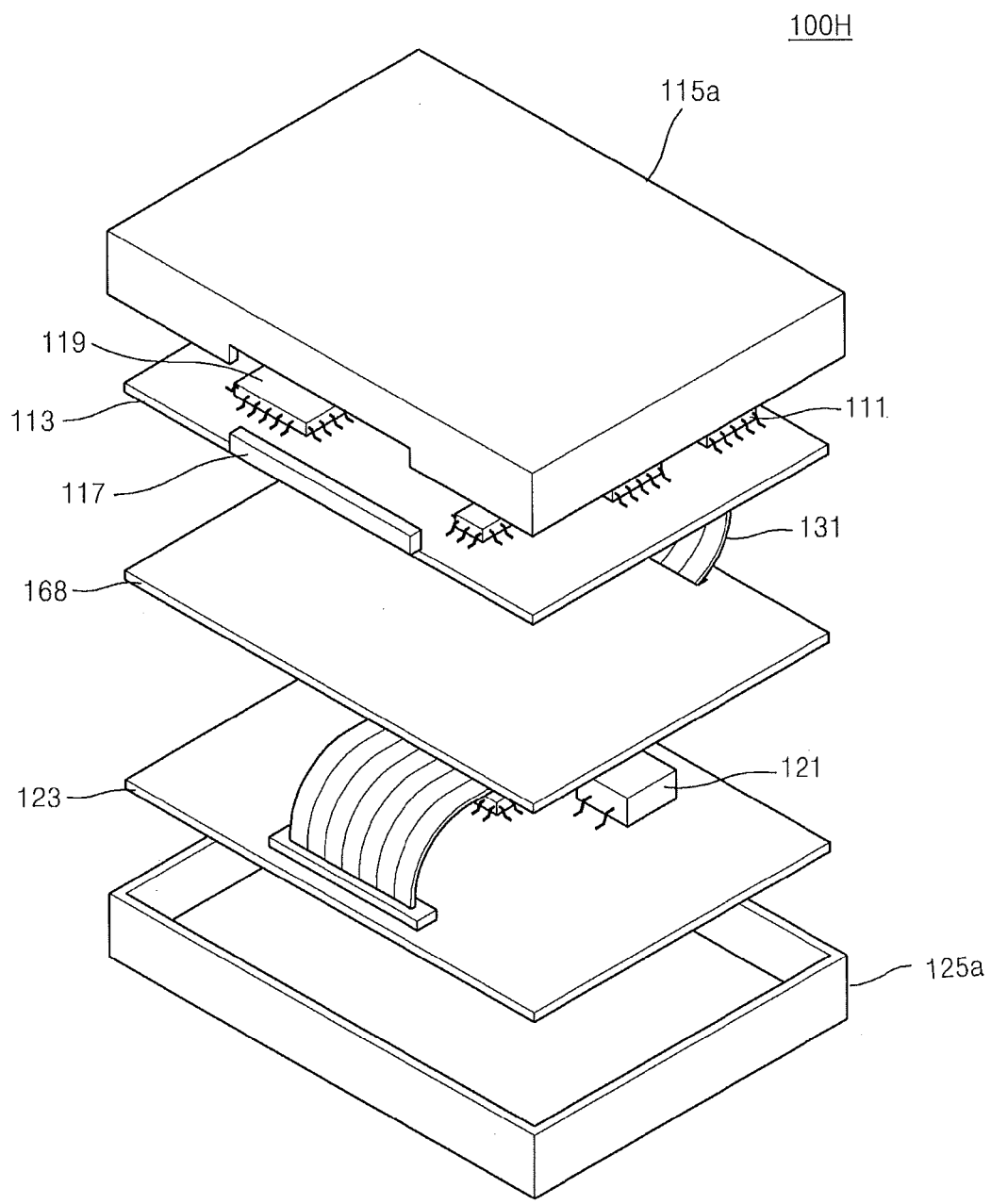
FIG. 9 is an exploded perspective view of a secondary memory unit according to yet a further embodiment of the inventive concept.

FIG. 9 is an exploded perspective view of a secondary memory unit 100H according to yet another embodiment of the inventive concept.

Referring to FIG. 9, a first case 115a may cover only a top surface of the first substrate 113, and a second case 125a may cover only a bottom surface of the second substrate 123. In this embodiment, the first substrate 113 and the second substrate 123 may be thermally separated from each other by using, for example, the insulating board 168.

The insulating board 168 may be formed of material having lower thermal conductivity than that of the first case 115a and/or the second case 125a, for example, epoxy-based polyurethane, aerogel, Teflon, mica, or the like. The insulating board 168 may reduce the amount of heat generated in the first substrate 113 that is transferred to the energy storage and supply medium 121 and thus may reduce the likelihood that the temperature of the energy storage and supply medium 121 rises excessively.

In addition, the material that is used to form the first case 115a may be selected to transfer heat more efficiently than does the material used to form the second case 125a. For example, the first case 115a may be formed of metal, such as copper, aluminum, or stainless steel, or a carbon-based material, and the second case 125a may be formed of polymer, such as epoxy resin, polymethylmethacrylate (PMMA), polycarbonate (PC), polyethylene (PE), or polypropylene (PP). When the first case 115a and the second case 125a are formed in this manner, a tendency to transfer heat generated in various semiconductor devices mounted on the first substrate 113 to another external device or medium rather than to transfer the heat to the energy storage and supply medium 121 disposed below the first substrate 113 may be increased.

Figure 10:
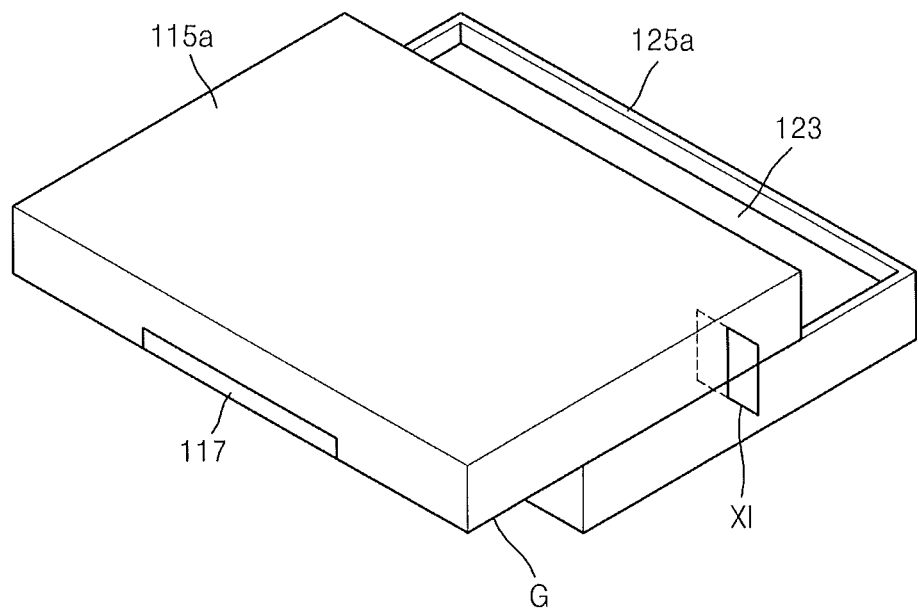
FIG. 10 is a perspective view of the secondary memory unit of FIG. 9 that illustrates how the secondary memory unit may be used.
Figure 11:
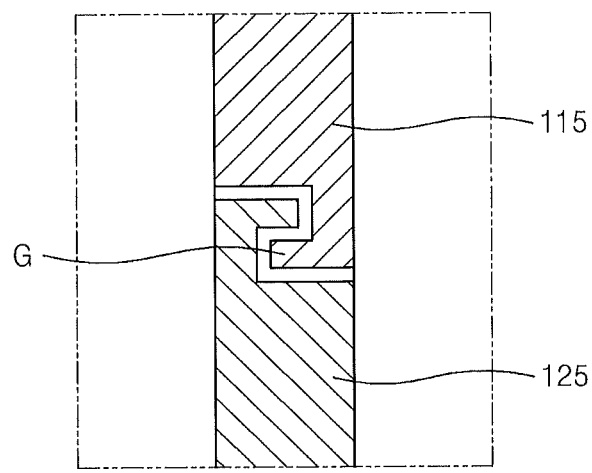
FIG. 11 is a cross-sectional view of a portion XI of FIG. 10.

FIG. 10 is a perspective view of an example state of use of the secondary memory unit 100H illustrated in FIG. 9. FIG. 11 is a partial cross-sectional view of a cross-section of a portion XI of FIG. 10.

Referring to FIGS. 10 and 11, the second case 125a protrudes in a forward direction by moving relative to the first case 115a. The first case 115a may include a guide G that allows the relative movement in a pre-defined direction. In other words, the movement may be performed when the first case 115a includes the guide G and the second case 125a is movable along the guide G. In FIG. 11, the guide G is rail-shaped. However, aspects of the inventive concept are not limited thereto, and the first case 115a may include any well-known type of guide.

As illustrated in FIG. 10, even when the second case 125a protrudes in the forward direction, the energy transfer medium 131 may be configured to maintain connection between the first substrate 113 and the second substrate 123, as illustrated in FIG. 9. Thus, when a defect occurs in the energy storage and supply medium 121, the second substrate 123 may be designed to be easily separated from the second case 125a. In addition, the energy transfer medium 131 may be easily separated from the second substrate 123.

In the above-described embodiments, the first substrate 113 and the second substrate 123 are detached from the first case 115a and the second case 125a, respectively, and thus may be thermally separated from each other to reduce heat transfer from the first substrate 113 to the energy storage and supply medium 121. In addition, the first substrate 113 on which the non-volatile memory units 111 are mounted and the second substrate 115 on which an energy storage and supply medium 121 is mounted, may be developed separately in parallel.

Since the development of the first substrate 113 that includes the non-volatile memory units and the first case 115a may be performed independently, technology development may be more efficiently performed. In other words, when the first substrate 113 and the second substrate 123 cannot be separated from each other, then both a case that includes an energy storage and supply medium and a case that does not include an energy storage and supply medium must be developed. In contrast, according to aspects of the inventive concept, when the first substrate 113 and the second substrate 123 can be separated from each other, after the development of the first substrate 113 including a non-volatile memory unit and the first case 115 and the development of the second case 125 relating to the energy storage and supply medium are separately performed, if the energy storage and supply medium is not needed, only the first case 115 may be used, and if the energy storage and supply medium is needed, the first case 115 and the second case 125 may be combined with each other.

Figure 12:
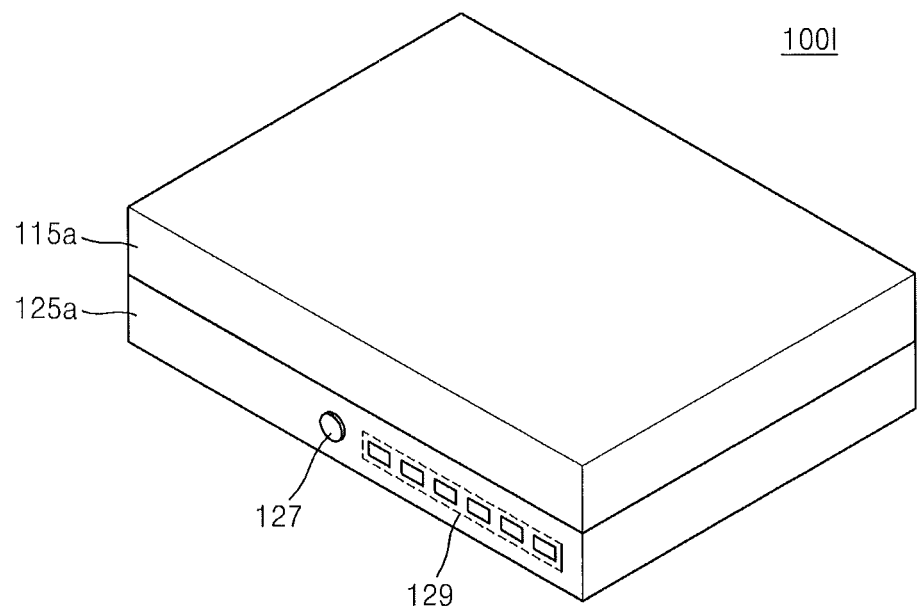
FIG. 12 is a front perspective view of a secondary memory unit according to yet another embodiment of the inventive concept.

FIG. 12 is a front perspective view of a secondary memory unit 100I according to yet another embodiment of the inventive concept.

As shown in FIG. 12, in this embodiment the secondary memory unit 100I includes a display device 129 that indicates, for example, a status of the energy storage and supply medium and/or the remaining amount of energy stored in the energy storage and supply medium 121. The display device 129 may be disposed in a portion of a second case 125 in which the energy storage and supply medium 121 is accommodated. The display device 129 may be any suitable display device, such as a light emitting diode (LED), a liquid crystal display (LCD) device, or the like. In addition, the display device 129 may be configured to operate for a predetermined amount of time only when an on/off button 127 is pressed. This configuration may be implemented by one of ordinary skill in the art, and thus the detailed description thereof is omitted.

Figure 13:
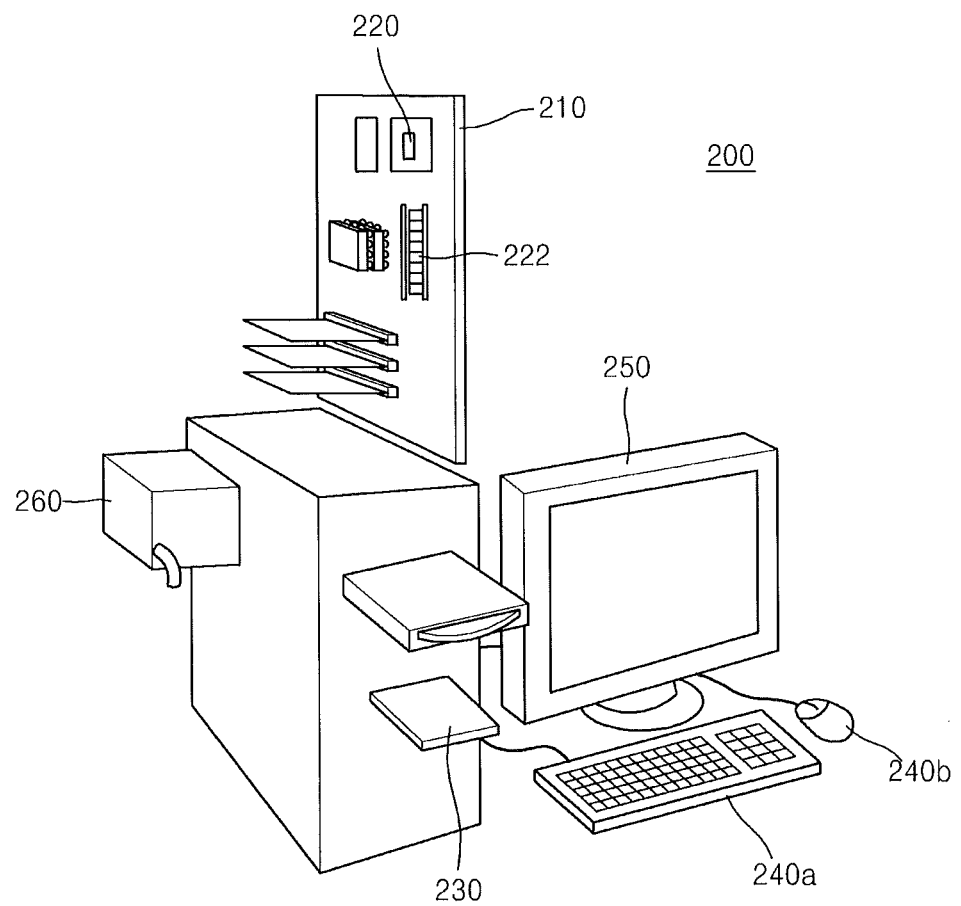
FIG. 13 is a conceptual view of a system according to an embodiment of the inventive concept.

FIG. 13 is a conceptual view of a system 200 according to yet another aspect of the inventive concept.

As shown in FIG. 13, the system 200 may include a main board 210, a central processing unit (CPU) 220 mounted on the main board 210, a secondary memory unit 230, input units 240a and 240b, and an output unit 250. The secondary memory unit 230 may be, for example, any one of the above-described secondary memory units 100A-100I.

The input units 240a and 240b may comprise, for example, a keyboard, a computer mouse or other electronic pointing device, touch screens, or the like. However, aspects of the inventive concept are not limited thereto. The input units 240a and 240b may be used to input data to the CPU 220. The output unit 250 may be a monitor, a printer, or the like. However, aspects of the inventive concept are not limited thereto. The output unit 250 may be a unit for outputting data from the CPU 220. The input units 240a and 240b and the output unit 250 may be integrated as a single device in some embodiments.

The CPU 220 and a main memory unit 222 may be mounted on the main board 210. The main memory unit 222 may be a random access memory (RAM) module, such as a dynamic RAM (DRAM). In addition, the main board 210 may be configured in such a way that a video card, a communication card, or the like may be further mounted on the main board 210. In addition, the main board 210 may be configured to exchange information with the secondary memory unit 230 by using communication standards, such as SATA or SATA-II.

In addition, the system 200 may include a power supply unit 260, and the power supply unit 260 may supply power to the main board 210 or the like.

The system 200 may be a desktop PC, a laptop PC, a smartphone, a tablet PC, a portable multimedia player (PMP), a navigation system, or a flat display device, such as a flat display television (TV).

As described above, a secondary memory unit and a system including the same according to the one or more embodiments of the inventive concept have high reliability and improved stability, and their product development and maintenance are convenient. In detail, a product, such as an SSD, which is manufactured based on the technical spirit of the inventive concept, may be configured to include a first substrate and a separate second substrate or a first case and a separate second case, or first and second substrates or cases that may be attached and detached from each other when the SSD is used in a notebook computer or a sever computer so that a criterion for the operating temperature of the product SSD may be satisfied and lifetime and reliability of the product may be improved. For example, even when a leakage current occurs due to overcharge of the energy storage and supply medium, such as a super capacitor, the leakage current does not affect a circuit other than the energy storage and supply medium, and the stability of the product may be greatly improved, and maintenance costs for the product may be reduced.

It will be appreciated that the above example embodiments may be combined in any way to provide a plurality of additional embodiments.

While the inventive concept has been particularly shown and described with reference to example embodiments thereof, it will be understood that various changes in form and details may be made therein without departing from the spirit and scope of the following claims.

What is claimed is:

1. A secondary memory unit comprising:
   a first substrate;
   a non-volatile memory unit that is mounted on the first substrate and which is configured to receive power from an external power supply;
   a second substrate that is separate from the first substrate;
   an energy storage and supply medium that is mounted on the second substrate; and
   an energy transfer medium that is configured to electrically connect the first substrate and the second substrate,
   wherein the energy storage and supply medium is configured to supply an operating power to the non-volatile memory unit when power from the external power supply to the non-volatile memory unit is cut off.

2. The secondary memory unit of claim 1, wherein the second substrate is spaced apart from the first substrate.

3. The secondary memory unit of claim 1, further comprising a first case in which the first substrate is at least partially accommodated and a second case in which the second substrate is at least partially accommodated.

4. The secondary memory unit of claim 3, wherein a thermally insulating material is disposed between the first substrate and the second substrate.

5. The secondary memory unit of claim 3, wherein the first case comprises metal or a carbon-based material, and the second case comprises a polymer material.

6. The secondary memory unit of claim 3, wherein the first case exposes the bottom surface of the first substrate, and the second case exposes the top surface of the second substrate, and the second substrate is disposed below the first substrate, and wherein the first substrate and the second substrate are thermally insulated from each other by an intervening insulating material.

7. The secondary memory unit of claim 6, wherein the first case further comprises a guide, and the second case is guided by the guide and is movable.

8. The secondary memory unit of claim 3, further comprising a display device that indicates an amount of charge included in the energy storage and supply medium.

9. The secondary memory unit of claim 1, wherein the first case covers both a top surface and a bottom surface of the first substrate, and wherein the second case covers both a top surface and a bottom surface of the second substrate.

10. The secondary memory unit of claim 9, wherein at least one spacer is disposed between the first case and the second case, wherein the spacer is configured to suppress heat transfer between the first case and the second case.

11. The secondary memory unit of claim 10, wherein the energy transfer medium electrically connects the first substrate and the second substrate via through the spacer.

12. The secondary memory unit of claim 9, wherein the first case and the second case are arranged in a direction perpendicular to a top surface of the first substrate or in parallel to a top surface of the first substrate.

13. The secondary memory unit of claim 9, wherein the second case comprises a recess and the first case is configured to be inserted into the recess to be combined with the second case.

14. The secondary memory unit of claim 1, in combination with:
 a central processing unit (CPU);
 an input unit for inputting information to the CPU; and
 an output unit for outputting information from the CPU,
 wherein the secondary memory unit is configured to transfer stored information to the CPU or for storing information output from the CPU.

15. A secondary memory unit comprising:
 a first substrate on which one or more non-volatile memory units are mounted; and
 a first case in which the first substrate is accommodated,
 wherein the first case comprises a first terminal configured to supply normal power to the non-volatile memory units from a primary power source that is external to the first case and a second terminal configured to supply a backup operating power to the non-volatile memory units from a backup power source that is external to the first case when the normal power is cut off.

16. A secondary memory unit, comprising:
 a first case that includes a first substrate that has a non-volatile memory unit mounted thereon;
 a second case that has a second substrate that has an energy storage and supply medium mounted thereon; and
 an energy transfer medium that electrically connects the first substrate to the second substrate and that is configured to selectively supply energy from the energy storage and supply medium to the non-volatile memory unit in response to power to the first substrate from a power supply that is external to the secondary memory unit being cut off.

17. The secondary memory unit of claim 16, further comprising at least one thermally insulative material that is disposed between the first substrate and the second substrate, wherein the first case is at least partially formed of a thermally conductive material and the second case is at least partially formed of a thermally insulative material.

18. The secondary memory unit of claim 16, wherein the energy transfer medium includes a plug that is associated with one of the first case or the second case and a socket that is associated with the other of the first case or the second case.

19. The secondary memory unit of claim 16, wherein the first substrate includes a top surface, a bottom surface, and a plurality of edge surfaces, and wherein the second substrate includes a top surface, a bottom surface, and a plurality of edge surfaces, and wherein a first of the edge surfaces of the first substrate faces a first of the edge surfaces of the second substrate.

20. The secondary memory unit of claim 16, wherein the first case is slidably moveable with respect to the second case.

* * * * *